(12) United States Patent
Kwon et al.

(10) Patent No.: US 7,888,772 B2
(45) Date of Patent: Feb. 15, 2011

(54) ELECTRONIC FUSE HAVING HEAT SPREADING STRUCTURE

(75) Inventors: Dae-Jin Kwon, Gyeonggi-do (KR);
Woo-Sik Kim, Gyeonggi-do (KR);
Maeda Shigenobu, Gyeonggi-do (KR);
Seung-Hwan Lee, Gyeonggi-do (KR);
Sung-Rey Wi, Gyeonggi-do (KR);
Wang-Xiao Quan, Gyeonggi-do (KR);
Hyun-Min Choi, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 523 days.

(21) Appl. No.: 12/013,290

(22) Filed: Jan. 11, 2008

(65) Prior Publication Data

US 2008/0211059 A1 Sep. 4, 2008

(30) Foreign Application Priority Data

Jan. 17, 2007 (KR) .................. 10-2007-0005419

(51) Int. Cl.
*H01L 29/00* (2006.01)
(52) U.S. Cl. .............................. 257/529; 257/E21.592
(58) Field of Classification Search ......... 257/529–543, 257/665, 675, 209, E23.147–149, E29.592
See application file for complete search history.

(56) References Cited

U.S. PATENT DOCUMENTS

| 5,331,195 | A | * | 7/1994 | Yukihiro ................... 257/529 |
| 5,444,287 | A | * | 8/1995 | Bezama et al. .............. 257/467 |
| 5,622,892 | A | | 4/1997 | Bezama et al. |
| 6,432,760 | B1 | | 8/2002 | Kothandaraman et al. |
| 6,433,404 | B1 | * | 8/2002 | Iyer et al. ................... 257/529 |
| 6,806,107 | B1 | | 10/2004 | Wu et al. |
| 7,388,273 | B2 | * | 6/2008 | Burr et al. ................... 257/529 |
| 2002/0113291 | A1 | * | 8/2002 | Adkisson et al. ............. 257/529 |
| 2008/0089159 | A1 | * | 4/2008 | Moy et al. ................... 257/529 |

FOREIGN PATENT DOCUMENTS

| JP | 63010516 A | * | 1/1988 |
| JP | 2004-228369 | | 8/2004 |
| JP | 2006-059969 | | 3/2006 |

* cited by examiner

*Primary Examiner*—Matthew W Such
*Assistant Examiner*—Ali Naraghi
(74) *Attorney, Agent, or Firm*—Muir Patent Consulting, PLLC

(57) ABSTRACT

A semiconductor device includes a fuse transistor for fuse programming and a fuse block connected to the fuse transistor, wherein the fuse block comprises a fuse line and a heat spreading structure connected to the fuse line. The electrical fuse employs the heat spreading structure connected to the fuse line to prevent a rupture of the electrical fuse such that heat, which is generated in the fuse line during a blowing of the fuse line, is spread throughout the heat spreading structure. Thus, a sensing margin of the electrical fuse can be secured and a deterioration of devices adjacent to the electrical fuse by heat generated in the electrical fuse can be prevented.

20 Claims, 3 Drawing Sheets

ELECTRONIC FUSE HAVING HEAT SPREADING STRUCTURE

CROSS-REFERENCE TO RELATED PATENT APPLICATION

This application claims the benefit of foreign priority to Korean Patent Application No. 10-2007-0005419, filed on Jan. 17, 2007, the disclosure of which is incorporated herein in its entirety by reference.

BACKGROUND

1. Field of Invention

Embodiments of the present invention relate to semiconductor devices, and more particularly, to an electrical fuse included in a semiconductor device and a method of manufacturing the electrical fuse.

2. Description of the Related Art

As semiconductor devices are becoming more highly integrated and the storage capacity thereof is increasing, defects are more likely to be formed in memory cells of the semiconductor devices during the manufacturing process of the semiconductor devices, and thereby, causing a decrease in the yield of the semiconductor devices. One of the well-known methods of solving this decrease in yield of semiconductor devices due to the high integration of semiconductor devices is by using a redundant circuit. If a defective main cell is detected by a predetermined test, a fuse in a fuse box corresponding to the defect is selected and opened so that a redundant cell, which is provided around the main cell, replaces the main cell that includes the defect.

The fuse is usually opened by radiating a laser beam that cuts the fuse due to the simplicity and reliability. However, the laser beam cutting method cannot be used in a package level, and as such, it is difficult to reduce the pitch of the fuse. Thus, the laser beam cutting method cannot be applied to semiconductor chips whose size is continuously reduced.

Thus an electrical fuse method, in which a current is supplied in order to cut the fuse, is well known to one skilled in the art and can be applied to solve this problem. In the electrical fuse method, the size of a fuse unit can follow the scaling of a semiconductor device and thereby reduce the occupied surface area in the semiconductor chips while the defective memory cells can be repaired, even in their packaged state.

FIG. 1 is a schematic view of an electrical fuse block for explaining the operation of a conventional electric fuse.

Referring to FIG. 1, the electrical fuse block includes a transistor 1 and the conventional electrical fuse 3 for fuse programming. A pulse voltage Vg is applied to a gate electrode of the transistor 1 to turn on the transistor 1. Then, an over current flows through the transistor 1 into the conventional electrical fuse 3. As a result, the conventional electrical fuse 3 is blown due to the over current that flows through the transistor 1.

FIG. 2 is a top view of the conventional electrical fuse shown in FIG. 1.

The conventional electrical fuse 3 is formed of a cathode 4, a fuse link 5, an anode 6 and contacts 7. The cathode 4 is connected to a drain of a transistor (not shown). When the transistor is turned on, a large amount of electrons migrate from the cathode 4 to the anode 6 through the fuse link 5. As a result, the fuse link 5 is blown. The resistance of the fuse is increased by the blowing of the fuse link 5. As a result, the conventional electrical fuse 3 is substantially opened.

The conventional electrical fuse 3 may be formed of a stack of a metal silicide layer on a polysilicon layer. The blowing of the conventional electrical fuse 3 may be accomplished in one of two modes: a thermo-migration (TM) mode or an electro-migration (EM) mode. In the TM mode, excessive heat is generated by the interaction between electrons and polysilicon elements in the fuse link 5. The excessive heat causes a rupture of the fuse link 5.

FIG. 3 shows a simulation of heat generated during blowing of the fuse link in the conventional electrical fuse shown in FIG. 2.

Referring to FIG. 3, the temperature of a center portion of the fuse link 5 is ten times or more than the temperature of the cathode 4 or the anode 6, and is increased up to several thousands of degrees during the blowing of the fuse link 5. Thus, if too much heat is generated in the fuse link 5, the conventional electrical fuse 3 is blown by a rupture. If the conventional electrical fuse 3 is blown by the rupture, a sensing margin, which is generated by the resistances of the conventional electrical fuse 3 before and after the blowing of the fuse link 5, is not sufficient. As a result, devices adjacent to the conventional electrical fuse 3 may be affected during the blowing of the fuse link 5.

SUMMARY

Embodiments of the present invention can be exemplarily characterized as providing an electrical fuse to secure a sensing margin of an electrical fuse by preventing a fuse rupture by reducing heat generated during the blowing of the electrical fuse and to prevent deterioration in the performance of devices adjacent to the electrical fuse due to the fuse rupture.

One exemplary embodiment of the present invention can be characterized as a semiconductor device that includes a fuse transistor for fuse programming and a fuse block connected to the fuse transistor. The fuse block may include a fuse line and a heat spreading structure connected to the fuse line.

Another exemplary embodiment of the present invention can be characterized as a semiconductor device that includes a fuse transistor for fuse programming, a fuse line connected to the fuse transistor and a heat spreading structure connected to the fuse link. The fuse line may include a cathode, an anode and a fuse link disposed between the cathode and the anode.

Yet another exemplary embodiment of the present invention can be characterized as a semiconductor device that includes a fuse transistor; and a fuse line connected to the fuse transistor. The fuse line may include a cathode; an anode; and a fuse link. A first end of the fuse link may be connected to the cathode and a second end of the fuse link may be connected to the anode. A heat spreading structure may be connected to the fuse link. A first portion of the heat spreading structure may be connected to the fuse link and a second portion of the heat spreading structure may be connected to the first portion of the heat spreading structure. The first portion of the heat spreading structure may be connected to the fuse link at a location substantially corresponding to a midpoint between the first and second ends of the fuse link. The first portion of the heat spreading structure may extend substantially perpendicularly away from the fuse link. At least a part of the second portion of the heat spreading structure may extend substantially perpendicularly away from the first portion of the heat spreading structure.

BRIEF DESCRIPTION OF THE DRAWINGS

The above and other features and advantages of the embodiments of the present invention will become more apparent by describing in detail exemplary embodiments thereof with reference to the attached drawings in which.

DETAILED DESCRIPTION

Figure 1:
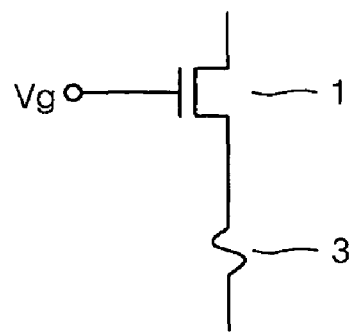
FIG. 1 is a schematic view of an electrical fuse block for explaining the operation of a conventional electrical fuse.
Figure 2:
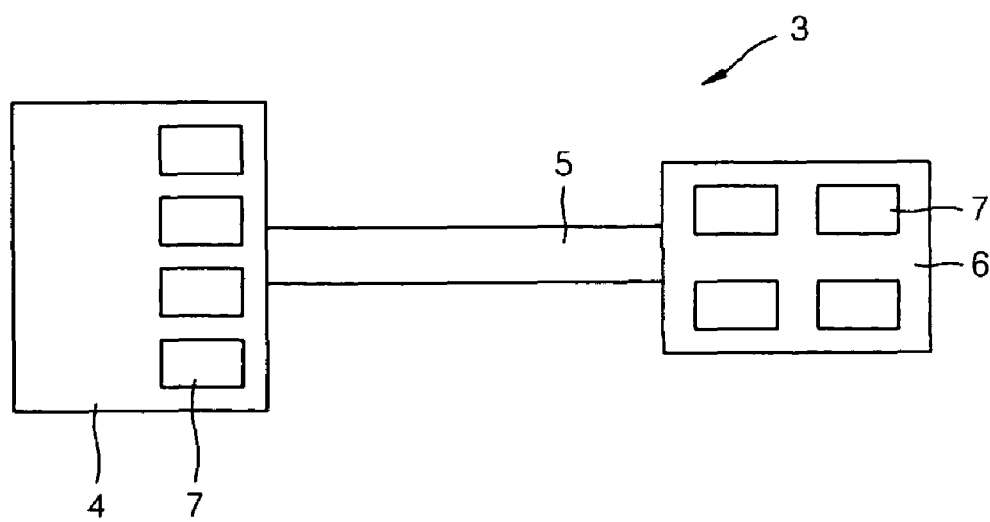
FIG. 2 is a top view of the conventional electrical fuse shown in FIG. 1.
Figure 3:
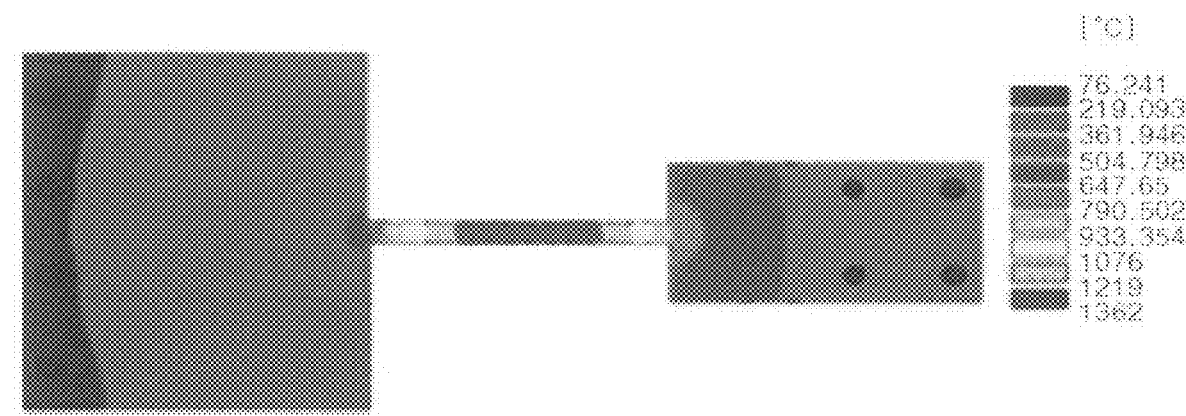
FIG. 3 is a schematic view illustrating a simulation of heat generated during blowing of a fuse link in the conventional electrical fuse shown in FIG. 2.

Exemplary embodiments of the present invention will now be described more fully with reference to the accompanying drawings. These embodiments may, however, be realized in many different forms, and should not be construed as being limited to the embodiments set forth herein; rather, these embodiments are provided so that this disclosure will be thorough and complete, and will fully convey the concept of the invention to one skilled in the art. The size of elements illustrated in the drawings is exaggerated for convenience of explanation.

Figure 4:
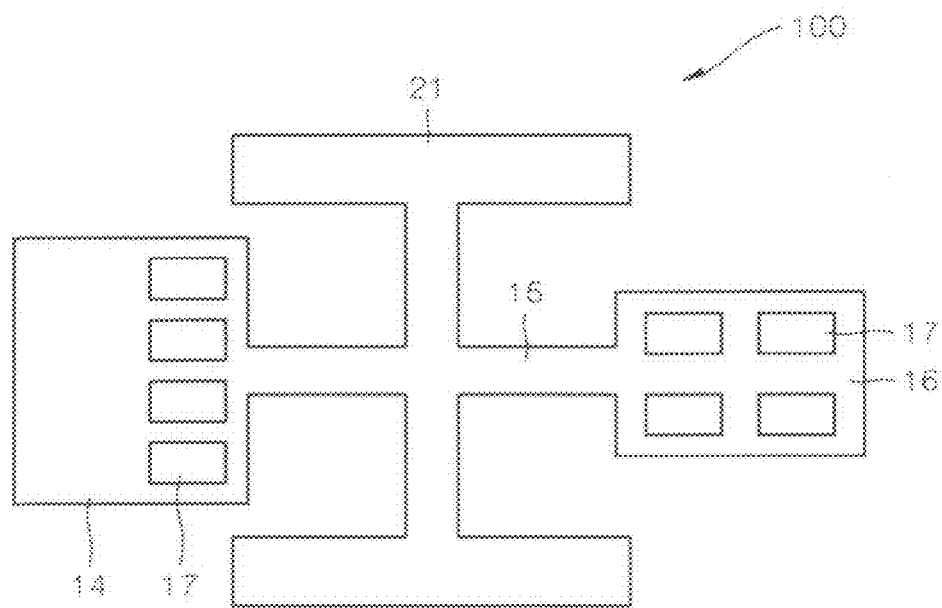
FIG. 4 is a top view of a fuse block of an electrical fuse including a heat spreading structure according to one embodiment of the present invention.

FIG. 4 is a top view of a fuse block of an electrical fuse including a heat spreading structure 21 according to an embodiment of the present invention.

Referring to FIG. 4, a fuse block 100 of an electrical fuse may include, for example, a fuse line composed of a cathode 14 at a first end, an anode 16 at a second end and a fuse link 15 between the cathode 14 and the anode 16. The cathode 14 is connected to a drain of a fuse transistor (not shown) for fuse programming. A plurality of contacts 17 are connected to the cathode 14 and the anode 16. In one embodiment, the heat spreading structure 21 spreads heat generated in the fuse link 15 during a blowing of the fuse link 15 and may be connected to the fuse link 15. The heat spreading structure 21 may be formed in the same plane as the fuse link 15, however, may also be formed in another plane different from the fuse link 15.

In one embodiment, the fuse link 15 may include two layers comprising a polysilicon layer and a metal silicide layer. The polysilicon layer may, for example, include doped (e.g., p-type doped) or be substantially undoped. The metal silicide layer may, for example, include a metal element such as Ti, Co, Ni, Ta, Al, Zr, Hf, W, Pt, Pd, Mo, V, Nb, or the like of a combination thereof.

In one embodiment, the heat spreading structure 21 may include two layers comprising a polysilicon layer and a metal silicide layer, as with the fuse link 15, to facilitate heat transfer. In another embodiment, however, the heat spreading structure 21 may include only a polysilicon layer or only a metal silicide layer. The polysilicon layer may, for example, include doped (e.g., p-type doped) or be substantially undoped. The metal silicide layer may, for example, include a metal element such as Ti, Co, Ni, Ta, Al, Zr, Hf, W, Pt, Pd, Mo, V, Nb, or the like of a combination thereof.

As a fuse transistor (not shown) is turned on, electrons from the cathode 14 flow to the anode 16 through the fuse link 15. As a result, atoms within the silicide layer of the fuse link 15 electromigrate near the cathode 14 to expose the polysilicon layer of the fuse link 15 therebelow. Thus, the silicide layer of the fuse link 15 is cut due to the EM. Electrons then flow through the polysilicon layer of the fuse link 15. The resistance of the silicide layer is several hundreds of ohms ($\Omega$) and the resistance of the polysilicon layer is 10,000$\Omega$ or greater. As a result, when the silicide layer is cut and the polysilicon layer is left, the electrical fuse has a high resistance to substantially open the electrical fuse. However, when electrons flow through the polysilicon layer, heat is generated in the fuse link 15 due to an interaction between the electrons and the polysilicon element. Such heat generated in the fuse link 15 can be distributed by the heat spreading structure 21 connected to the fuse link 15.

Figure 5:
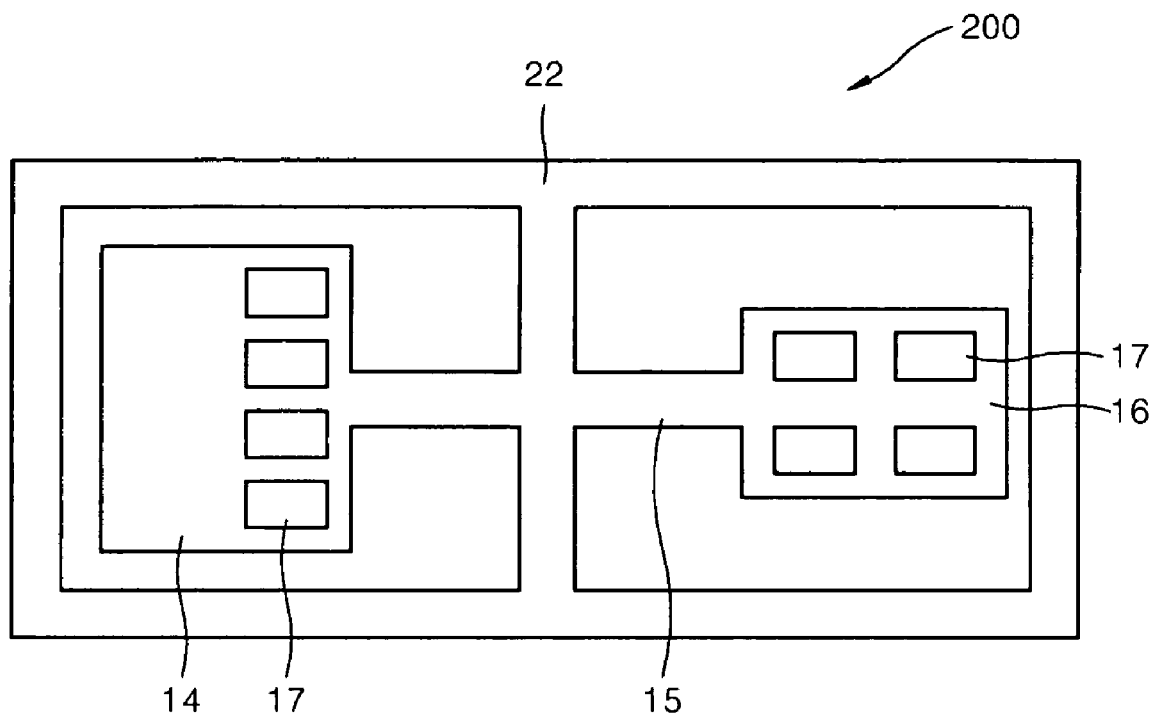
FIG. 5 is a top view of a fuse block of an electrical fuse including a heat spreading structure according to another embodiment of the present invention.

The surface area of the heat spreading structure 21 may be made large to increase the amount of distributed heat. The form of the heat spreading structure 21 may be compact in order to prevent an increase in the occupied surface area of the fuse block 100. As exemplarily illustrated in FIG. 4, the heat spreading structure 21 has a bar form, is disposed parallel to the fuse link 15, and has a length extending toward the cathode 14 and the anode 16. As a result, the surface area of the heat spreading structure 21 may be extended and the entire size of the fuse block 100 may be increased. It will be appreciated, however, that the form of the heat spreading structure 21 may vary. For example, a heat spreading structure 22, as exemplarily illustrated in FIG. 5, is in a ring form surrounding the fuse line. The ring may be cornered as a rectangle as illustrated in FIG. 5 or may be modified in other forms according to the form of the fuse link 15.

If the heat spreading structure 22 is employed with a fuse line as exemplarily described above, the electric potential is applied only between the cathode 14 and the anode 16. As a result, electrons passing through the cathode 14 are not lost to the heat spreading structure 21. However, since heat is spread by the differences between temperatures, heat generated in the fuse link 15 can be spread throughout the heat spreading structure 21, which has a lower temperature than the fuse link 15. Thus, a rupture of the polysilicon layer of the fuse link 15 due to excessive heat can be prevented and only the metal silicide layer of the fuse link 15 experiences electromigration.

In one embodiment, the heat spreading structure 21, which is connected to the fuse link 15, may also be connected to a substrate in order to spread heat efficiently.

In one embodiment, the cathode 14 may have a larger surface area than the anode 16 in order to increase the EM through the silicide layer during the blowing of the fuse link 15. However, the cathode 14 and the anode 16 may also have substantially the same surface area.

As exemplarily illustrated in FIGS. 4 and 5, the heat spreading structure 21 or 22 may be exemplarily characterized as including a first portion that is directly connected to the fuse link 15 and a second portion that is directly connected to the first portion. Accordingly, the first portion of the heat spreading structure 21 or 22 may be directly connected to the fuse link 15 at a location substantially corresponding to a midpoint between the first and second ends thereof (e.g., at a midpoint between the cathode 14 and anode 16, if the fuse link 15 is essentially linear). The first portion of the heat spreading structure 21 or 22 may extend substantially perpendicularly away from the fuse link 15 and at least a part of the second portion of the heat spreading structure 21 or 22 may extend substantially perpendicularly away from the first portion of the heat spreading structure 21 or 22. Accordingly, at least a part of the second portion of the heat spreading structure 21 or 22 may be substantially parallel to the fuse link 15. In addition, as exemplarily illustrated in FIGS. 4 and 5, the first portions of the heat spreading structure 21 or 22 may extend in opposite directions away from the fuse link 15. As shown in FIG. 4, second portions of the heat spreading structure 21 may be spaced apart from each other and be arranged substantially symmetrically with respect to a longitudinal axis of the fuse link 15. As shown in FIG. 5, second portions of the heat spreading structure 22 may be connected to each other and be arranged substantially symmetrically with respect to a longitudinal axis of the fuse link 15.

According to embodiments of the present invention, an electrical fuse may employ a heat spreading structure with a fuse link. As a result, heat generated in the fuse link during a blowing of the fuse link is spread throughout the heat spreading structure to prevent a rupture of the electrical fuse. Accordingly, a sensing margin of the electrical fuse can be secured and a deterioration of devices connected to the electrical fuse due to heat generated in the fuse can be prevented.

While the embodiments of present invention have been exemplarily shown and described above, it will be understood by one of ordinary skill in the art that various changes in form and details may be made therein without departing from the spirit and scope of the present invention as defined by the following claims.

What is claimed is:

1. A semiconductor device comprising: a fuse transistor for fuse programming; and a fuse block connected to the fuse transistor, wherein the fuse block comprises a fuse line and a heat spreading structure connected to the fuse line wherein the fuse line includes a fuse link disposed between a first node and a second node, and comprises a first end connected to the first node and a second end connected to the second node, wherein a length of the fuse link extends from the first node to the second node and a width of the fuse link extends in a direction perpendicular to the length of the fuse link, wherein the heat spreading structure is connected to the fuse link and comprises at least a first portion and a second portion, wherein the first portion of the heat spreading structure is connected to the fuse link, and extends in the direction perpendicular to the length of the fuse link and beyond a first surface and an opposite surface of the fuse link from a location Corresponding to a midpoint between the first and second ends of the fuse link, wherein the first portion of the heat spreading structure includes a first end and a second end, and wherein the second portion of the heat spreading structure connects to the first portion at the first end of the first portion and extends in a direction perpendicular to the first portion, and wherein the heat spreading structure comprises a ring structure surrounding the fuse line.

2. The semiconductor device of claim 1, wherein the heat spreading structure comprises a ring structure surrounding the fuse line.

3. The semiconductor device of claim 1, wherein the heat spreading structure comprises at least one bar.

4. The semiconductor device of claim 1, wherein the heat spreading structure comprises a plurality of bars that are substantially parallel to the fuse link.

5. The semiconductor device of claim 1, wherein the fuse link comprises a polysilicon layer and a metal silicide layer.

6. The semiconductor device of claim 1, wherein the heat spreading structure comprises polysilicon, metal silicide, or a combination thereof.

7. The semiconductor device of claim 6, wherein the polysilicon comprises doped polysilicon.

8. The semiconductor device of claim 7, wherein the polysilicon is doped with p-type impurities.

9. The semiconductor device of claim 6, wherein the polysilicon is substantially undoped.

10. The semiconductor device of claim 6, wherein the metal silicide comprises Ti, Co, Ni, Ta, Al, Zr, Hf, W, Pt, Pd, Mo, V, Nb, or the like or a combination thereof.

11. The semiconductor device of claim 1, wherein the heat spreading structure is connected to a semiconductor substrate.

12. The semiconductor device of claim 1, further comprising at least one contact connected to at least one of the first node and the second node.

13. The semiconductor device of claim 1, wherein the first node has a larger surface area than the second node.

14. The semiconductor device of claim 1, wherein the first node has substantially the same surface area as the second node.

15. A semiconductor device comprising: a fuse transistor for fuse programming; a fuse line connected to the fuse transistor, the fuse line comprising a cathode, an anode, and a fuse link disposed between the cathode and the anode; and a heat spreading structure connected to the fuse link wherein the fuse line includes a fuse link disposed between the cathode and the anode and comprising a first end connected to the cathode and a second end connected to the anode, wherein a length of the fuse link extends from the first node to the second node and a width of the fuse link extends in a direction perpendicular to the length of the fuse link, wherein the heat spreading structure is connected to the fuse link and comprises at least a first portion and a second portion, wherein the first portion of the heat spreading structure is connected to the fuse link, and extends in the direction perpendicular to the length of the fuse link and beyond a first surface and an opposite surface of the fuse link from a location corresponding to a midpoint between the first and second ends of the fuse link, wherein the first portion of the heat spreading structure includes a first end and a second end, and wherein the second portion of the heat spreading structure connects to the first portion at the first end of the first portion and extends in a direction perpendicular to the first portion, and wherein the heat spreading structure comprises a ring structure surrounding the fuse line.

16. The semiconductor device of claim 15, wherein the fuse link and the first portion of the heat spreading structure comprise a cross structure.

17. The semiconductor device of claim 15, wherein the heat spreading structure comprises a plurality of bars substantially parallel to the fuse link.

18. The semiconductor device of claim 1, wherein the fuse link and the first portion of the heat spreading structure comprise a cross structure.

19. The semiconductor device of claim 1, wherein the heat spreading structure further includes a third portion, wherein the third portion connects to the first portion at the second end of the first portion and extends in a direction perpendicular to the first portion.

20. The semiconductor device of claim 15, wherein the heat spreading structure further includes a third portion, wherein the third portion connects to the first portion at the second end of the first portion and extends in a direction perpendicular to the first portion.

* * * * *